United States Patent
Yeohi et al.

(10) Patent No.: US 7,659,192 B2
(45) Date of Patent: Feb. 9, 2010

(54) METHODS OF FORMING STEPPED BUMPS AND STRUCTURES FORMED THEREBY

(75) Inventors: Andrew Yeohi, Portland, OR (US);
Guotao Wang, Chandler, AZ (US);
Sairam Agraharam, Phoenix, AZ (US);
Sudarshan Rangaraj, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/648,498

(22) Filed: Dec. 29, 2006

(65) Prior Publication Data

US 2008/0157356 A1     Jul. 3, 2008

(51) Int. Cl.
*H01L 21/44* (2006.01)

(52) U.S. Cl. .............................. 438/613; 257/E21.508; 257/E21.513

(58) Field of Classification Search ................. 438/613; 257/E21.508, E21.513
See application file for complete search history.

(56) References Cited

U.S. PATENT DOCUMENTS

| 5,739,053 | A * | 4/1998 | Kawakita et al. ............ 438/108 |
| 6,074,893 | A * | 6/2000 | Nakata et al. ............... 438/106 |
| 2002/0076912 | A1 * | 6/2002 | Suzuki ....................... 438/613 |
| 2002/0127836 | A1 * | 9/2002 | Lin et al. .................... 438/612 |

FOREIGN PATENT DOCUMENTS

JP          09321138    * 12/1997

* cited by examiner

*Primary Examiner*—Asok K Sarkar
(74) *Attorney, Agent, or Firm*—Kathy J. Ortiz

(57) ABSTRACT

Methods of forming a microelectronic device and associated structures are described. Those methods may comprise forming a die-side conductive interconnect on a substrate, wherein the die-side conductive interconnect comprises a columnar portion and a base portion, and wherein a diameter of the base portion is greater than a diameter of the columnar portion.

12 Claims, 9 Drawing Sheets

METHODS OF FORMING STEPPED BUMPS AND STRUCTURES FORMED THEREBY

BACKGROUND OF THE INVENTION

After a microelectronic chip or die has been manufactured, it is typically packaged before it is sold. The package may provide electrical connection to the chip's internal circuitry, protection from the external environment, and heat dissipation, for example. In one type of package system, a chip may be "flip-chip" connected to a package substrate. In a flip-chip package, conductive connections may be distributed on a surface of the die that may be electrically coupled to corresponding conductive connections on the package substrate.

During die-package assembly, the coefficient of thermal expansion (CTE) mismatch between the die and the package may cause thermomechanical stresses during the thermal cycling that is intrinsic to assembly processing. The introduction of weaker low-K (typically below about 4) ILD's within the die architecture may amplify the negative effects of such stresses. Low k ILD materials are desirable as they may reduce the RC delay in die backend structures. However, low k layers may crack during the chip joining processes as they may be mechanically weaker and may be more susceptible to the aforementioned thermomechanical stresses from the thermal mismatch between silicon die and organic substrates, for example. This problem becomes more severe when lead-free solder materials are used, since many lead-free solders comprise much higher elastic modulus and yield strength. Hence, many lead free solders can transfer much higher stress into low k layers than traditional Sn—Pb eutectic solders.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
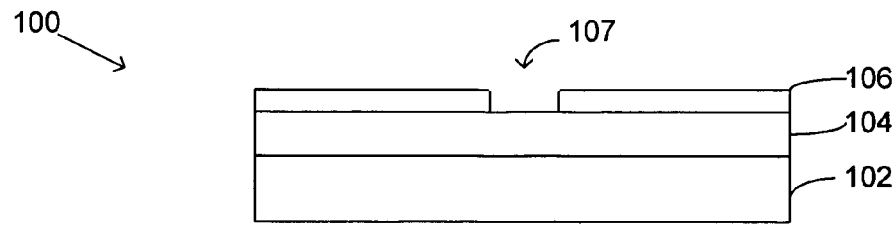
FIGS. 1a-1j represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may comprise forming a die-side conductive interconnect structure on a portion of a die, wherein the die-side conductive interconnect structure comprises a columnar portion and a base portion, and wherein a diameter of the base portion is greater than a diameter of the columnar portion. Methods and structures of the present invention may significantly decrease the thermomechanical stress that may be present in die passivation layers as well as low k ILD layers during chip attach processing, for example. Additionally, embodiments of the present invention may enable the use of lead free solders with low k dielectric materials.

FIGS. 1a-1j illustrate an embodiment of a method of forming a microelectronic structure, such as a die-side conductive interconnect structure, for example. FIG. 1a illustrates a cross-section of a portion of a substrate 100. In one embodiment, the substrate 100 may comprise a portion of a die, for example. In one embodiment, the substrate 100 may be part of a wafer having a plurality of dice or the substrate 100 may be an individual and separate integrated circuit. In one embodiment, the substrate 100 may comprise a device layer 102, a device interconnect layer 104 disposed on the device layer 102 and a passivation layer 106 disposed on the device interconnect layer 104. The substrate 100 may have at least one opening 107 that may serve to electrically couple various conductive materials to the device layer 102 through the device interconnect layer 104.

In one embodiment, the device layer 102 of the substrate 100 may comprised of materials such as, but not limited to, silicon, silicon-on-insulator, germanium, indium antimonide, lead telluride, indium arsenide, indium phosphide, gallium arsenide, gallium antimonide, or combinations thereof. In one embodiment, the device layer 102 may include devices such as transistors, resistors, or conductors that may form an integrated circuit. In another embodiment, the device layer 102 may include devices that together form multiple microprocessor cores on a single die.

The device interconnect layer 104 may include interconnect regions (not detailed) that may provide electrical interconnection for the various devices of the device layer 102. The device interconnect layer 104 may include stacks of metallization layers that may comprise metal lines that may be separated and/or insulated by dielectric materials, such as interlayer dielectric layers (ILD's). The device interconnect layer 104 may include low-k materials, which may have a dielectric constant (k) of less than about 4. In one embodiment, the device interconnect layer 104 may contain multiple layers of dielectric material, such as a plurality of low k dielectric layers.

Figure 1B:
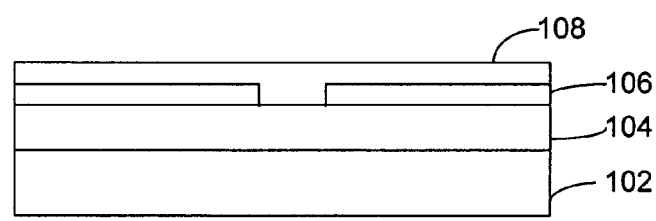

In one embodiment, the passivation layer 106 disposed on the device interconnect layer 104 of the substrate 100 may comprise a dielectric material, such as but not limited to silicon nitride and/or silicon dioxide, although the passivation layer 106 may comprise any material suitable for passivating the substrate 100. In an embodiment, a seed layer 108 may be formed on the passivation layer 106 and on a portion of the device interconnect layer 104 through the opening 107 (FIG. 1b).

Figure 1C:
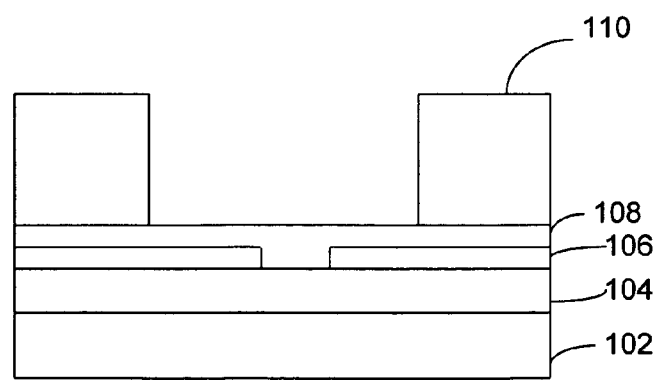

The seed layer 108 may be electrically coupled to the device layer 102 through the at least one opening 107. The seed layer 108 may comprise any type of conductive layer, such as copper, for example. The seed layer 108 may be formed utilizing any suitable formation process, such as but not limited to a physical vapor deposition (PVD) process, for example. In one embodiment, the seed layer 108 may function to provide a surface for the electroplating of a conductive material, such as but not limited to copper, for example. In one embodiment, the seed layer 108 may be patterned utilizing a photoresist material 110, for example, as is known in the art (FIG. 1c).

Figure 1D:
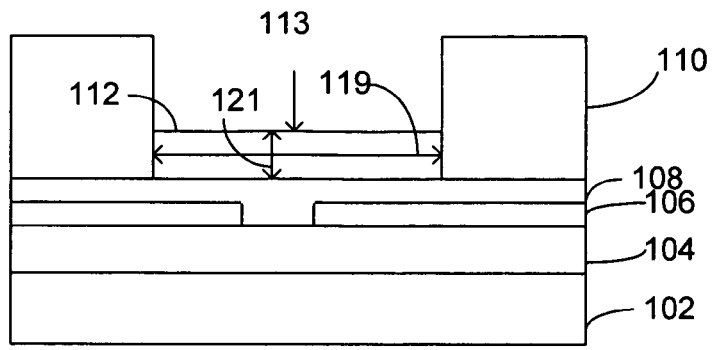

A base portion 112 of a die-side conductive interconnect structure may be formed on the seed layer 108 of the substrate 100 (which in some cases may comprise a portion of a die (FIG. 1d). In one embodiment, the base portion 112 may comprise copper, but may also comprise any suitable type of conductive material, depending upon the particular application. In one embodiment, the base portion 112 may be formed utilizing any suitable formation process, such as but not limited to an electroplating process or a PVD process, for example.

The base portion 112 of the die-side conductive interconnect structure may comprise a diameter 119, and a height 121, which may be optimized depending upon the particular application. In one embodiment, the base portion 112 dimensions may comprise any such dimensions that may be suitable for a die-side conductive interconnect structure, for example. The base portion 112 of the die-side conductive interconnect structure may comprise a top surface 113.

The base portion 112 of the die-side conductive interconnect structure may be electrically coupled to a portion of the device interconnect layer 104 (that in turn is internally connected to the device layer 102) through the seed layer 108. In one embodiment, the diameter 119 of the base portion 112 may comprise about 80 microns to about 120 microns, while the height 121 of the base portion 112 may comprise about 5 microns to about 30 microns.

Figure 1E:
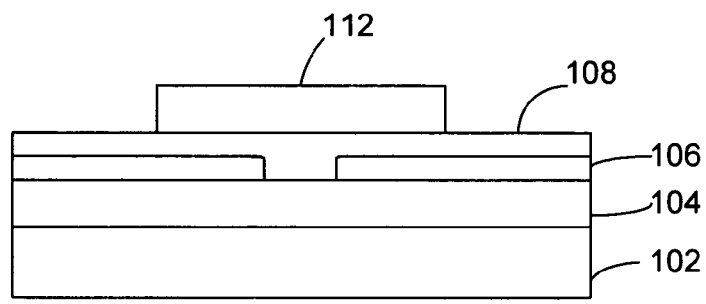
Figure 1F:
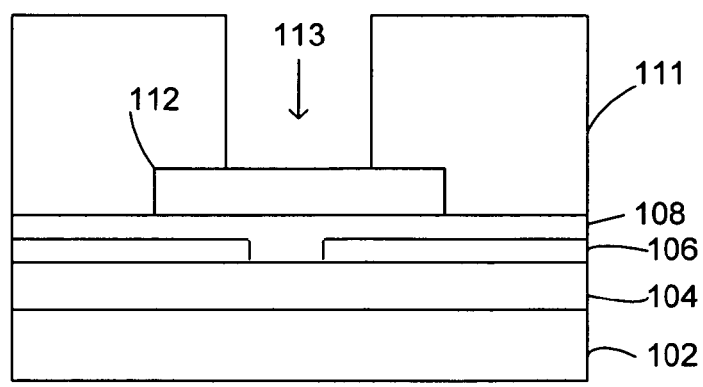
Figure 1G:
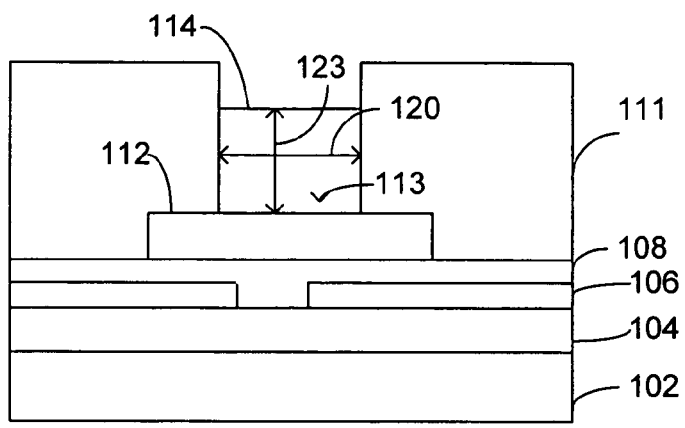

Upon formation of the base portion 112, the photoresist 110 may be removed (FIG. 1e). Additional photoresist 111 may then be placed on the base portion 112 (FIG. 1f) to pattern the columnar portion 114 of the die-side conductive interconnect structure that may be formed on the top surface 113 of the base portion 112 (FIG. 1g). The additional photoresist 111 may be used to optimize a diameter 120 and a height 123 of the columnar portion 114 of the die-side conductive interconnect structure. In one embodiment, the columnar portion 114 may comprise copper, and may be formed utilizing any suitable formation process, such as but not limited to an electroplating process, for example.

Figure 1H:
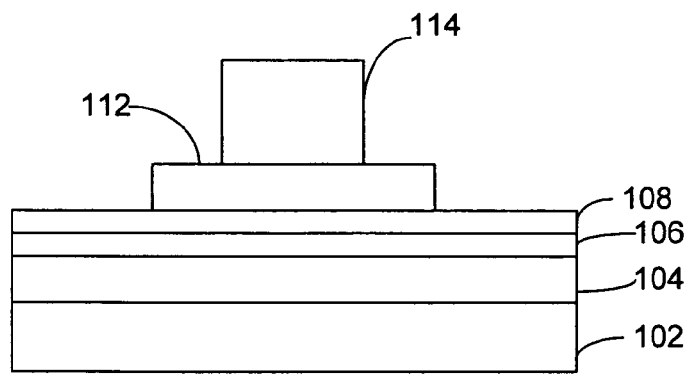
Figure 1I:
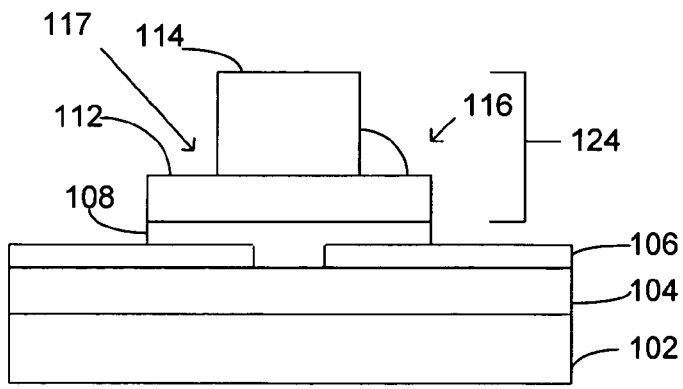

The additional photoresist 111 may be removed (FIG. 1h). In one embodiment, the seed layer 108 may be patterned and etched, for example, to remove the portion of the seed layer 108 that is adjacent to the perimeter of the base portion 112 (FIG. 1i). Thus, a die-side conductive interconnect structure 124 may be formed on the substrate 100 that may comprise a base portion 112 and a columnar portion 114.

In one embodiment, the die-side conductive interconnect structure 124 may comprise a conductive bump that may be disposed on a substrate and electrically coupled to a die, for example. In one embodiment, an angle 116 between the columnar portion 114 and the base portion 112 of the die side conductive interconnect structure 124 may comprise between about 80 to about 100 degrees. In one embodiment, it is desirable to have the angle 116 as close to 90 degrees as possible, rather than employing a targeted slope design.

The columnar portion 114 and the base portion 112 of the die-side conductive interconnect structure 124 may comprise distinct portions of the die-side conductive interconnect structure 124, in that a transitional region 117 between the columnar portion 114 and the base portion 112 may be sharp (i.e., without gradation of diameters of the two portions), where the transitional region 117 may comprise a right angle (substantially 90 degrees) in some cases. In one embodiment, the diameters of the columnar portion 114 and the base portion 112 of the die side conductive interconnect structure 124 may be substantially constant throughout their respective heights.

Figure 1J:
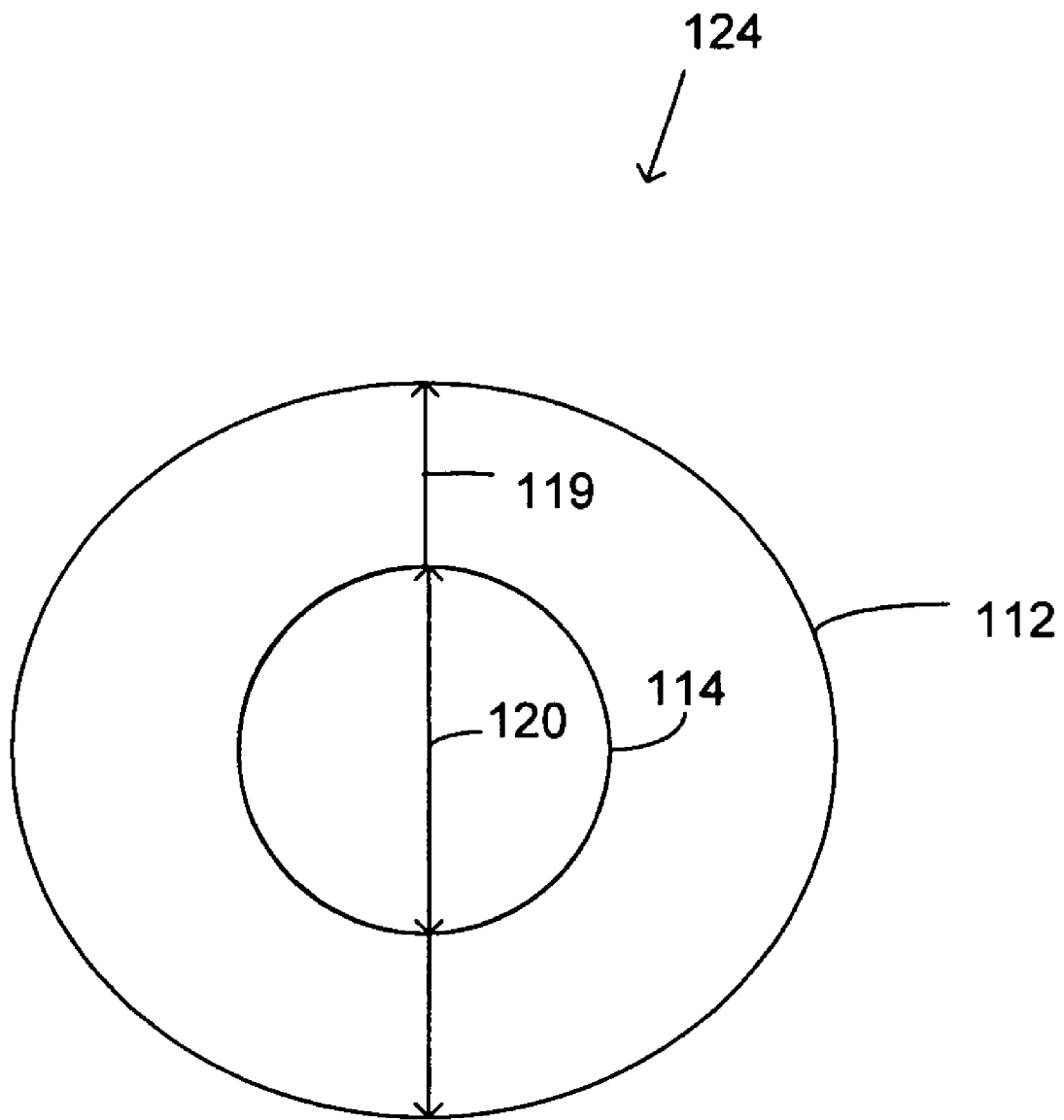

FIG. 1j depicts a top view of the die-side conductive interconnect structure 124. The diameter 119 of the base portion 112 may be substantially greater than the diameter 120 of the columnar portion 114. In one embodiment, the diameter 120 of the columnar portion 114 may comprise about 50 percent to about 80 percent of the diameter 119 of the base portion 112. In one embodiment, the die-side conductive interconnect structure 124 of the various embodiments of the present invention when coupled to a package-side solder bump that may be disposed on a package substrate, may comprise a portion of a joint structure (see the joint structure 226 in FIG. 2d for example).

Because the die-side conductive interconnect structure 124 comprises a wider base portion 112, die-package interaction stresses that may occur in the device layer 102 and device interconnect layer 104 during various packaging and/or assembly processes may be reduced. By having a base portion of the die-side conductive interconnect that is wider than the columnar portion, the lines of force resulting from the CTE mismatch moments harbored after thermal processing are substantially contained within the base portion of the die-side interconnect structure.

In some cases, without the wider base portion, the lines of force would likely diverge at the passivation layer interface (boundary between 106 and 108), which may result in cracking of layer 106 and consequently yield loss. In essence, the wider base portion of the die-side conductive interconnect 124 moves the stress/force divergence away from the comparatively more fragile interface between dissimilar materials, i.e. the passivation layer 106 and the die-side conductive interconnect.

The wider base portion 112 may sufficiently reduce the stresses from various packaging steps, without utilizing solder materials with high ductility, such as lead-tin solders. Such a design may also provide an avenue towards incorporation of lower strength materials within the passivation layer 106 and/or the device interconnect layer 104.

Figure 2A:
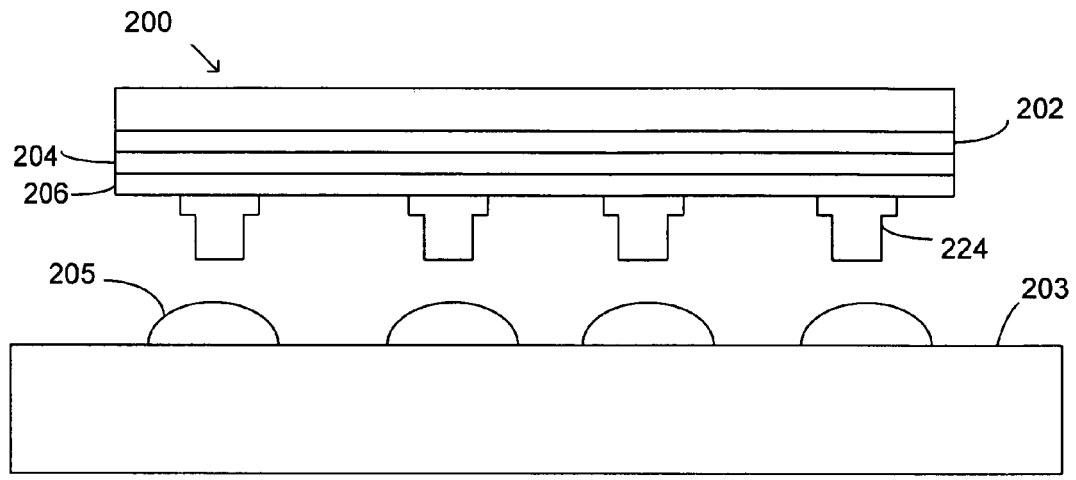
FIGS. 2a-2d represent structures according to an embodiment of the present invention.

FIG. 2a illustrates a substrate 200 that may comprise a device layer 202, a device interconnect layer 204 and a passivation layer 206, similar to the substrate 100 of FIG. 1a, for example. In one embodiment, the substrate 200 may comprise a plurality of device interconnect layers 204, which may comprise at least one low k dielectric layer in some cases. At least one die-side conductive interconnect structure 224, similar to the die-side conductive interconnect structure 124 of FIG. 1i for example, may be disposed on the substrate 200. The at least one die-side conductive interconnect structure 224 may be located in any suitable pattern on the substrate 200 depending upon the particular application.

A second substrate 203 may comprise a package substrate in some embodiments, and may further comprise at least one solder bump 205. The second substrate 203 may include any suitable packaging substrate, such as but not limited to a printed circuit board (PCB), interposer, motherboard, card, or the like. The at least one solder bump 205 may comprise any suitable solder material, including lead-based solders or lead-free solders. Examples of lead-free solders may include alloys of tin and silver or alloys of tin and indium.

In one embodiment, individual ones of the at least one die-side conductive structure 224 and individual ones of the at least one solder bump 205 may be positioned such that individual die-side conductive interconnect structures 224 and individual solder bumps 205 may be substantially aligned and/or in close proximity to each other.

Figure 2B:
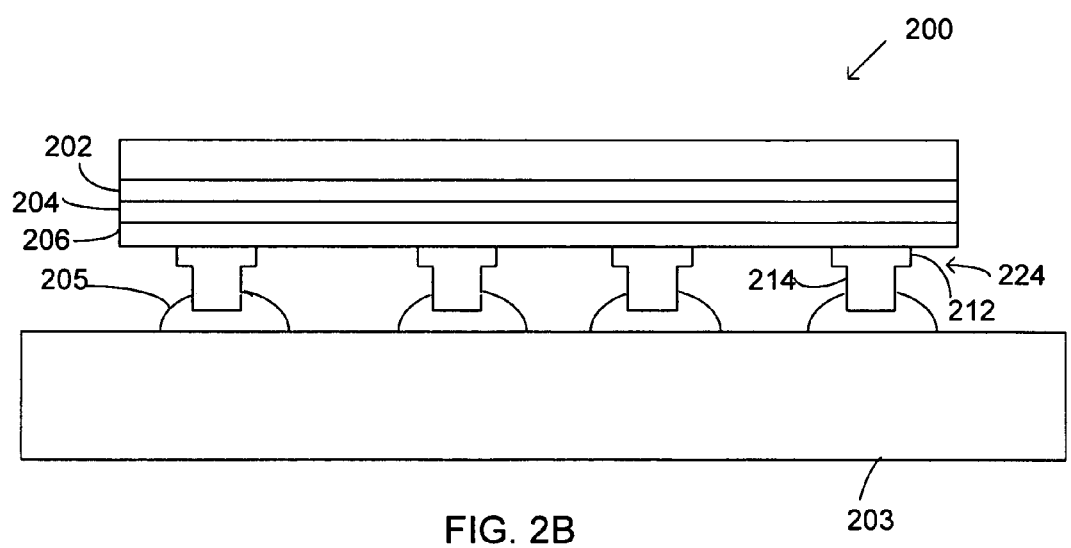

The substrate 200 and the second substrate 203 may be brought together, such that a columnar portion 214 of individual ones of the at least one die-side conductive structure 224 and individual ones of the at least one solder bump 205 may be brought into contact with each other wherein individual ones of the at least one die-side conductive structure 224 and individual ones of the at least one solder bump 205 may be attached and/or electrically coupled to each other (FIG. 2b). The process of joining the individual ones of the at least one die-side conductive structure 224 and the individual ones of the at least one solder bump 205 may comprise a chip attach process, in some cases.

In one embodiment, an elevated temperature may be employed during the attachment of the at least one solder bump 205 to the at least one die-side conductive interconnect structure 224. In one embodiment, portions of the solder material of the at least one solder bump 205 may melt, and upon cooling, may form joints with the at least one die-side conductive structure 224, that may electrically couple the substrate 200 and the second substrate 203.

Figure 2C:
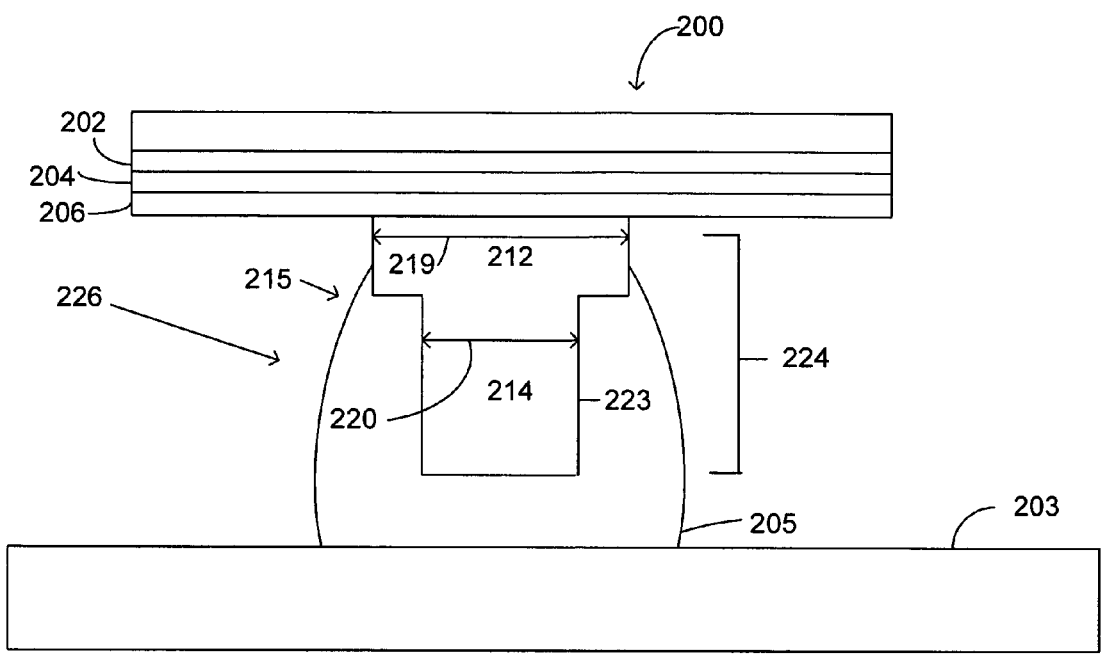

Referring to FIG. 2c, which depicts an individual solder bump/die-side conductive interconnect structure connection (i.e. the connection between the solder bump and the die-side conductive interconnect structure may comprise a portion of a joint structure 226), portions of the solder material 215 from individual ones of the at least one solder bump 205 may coat individual ones of the at least one die-side conductive interconnect structure 224. In one embodiment, the solder portions 215 may coat at least fifty percent of the at least one connective interconnect structure 224.

Figure 2D:
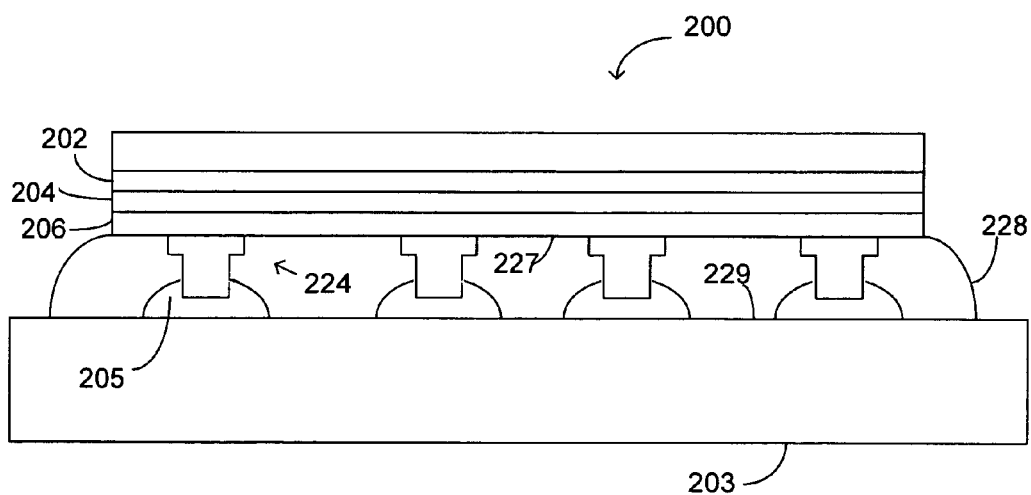

Next, as illustrated in FIG. 2d an underfill material 228 may be used between a surface 227 of the substrate 200 (that may include at least one die) and a surface of 229 of the second substrate 203. In one example, underfill material 228 may be provided by a capillary underfill process.

Figure 3A:
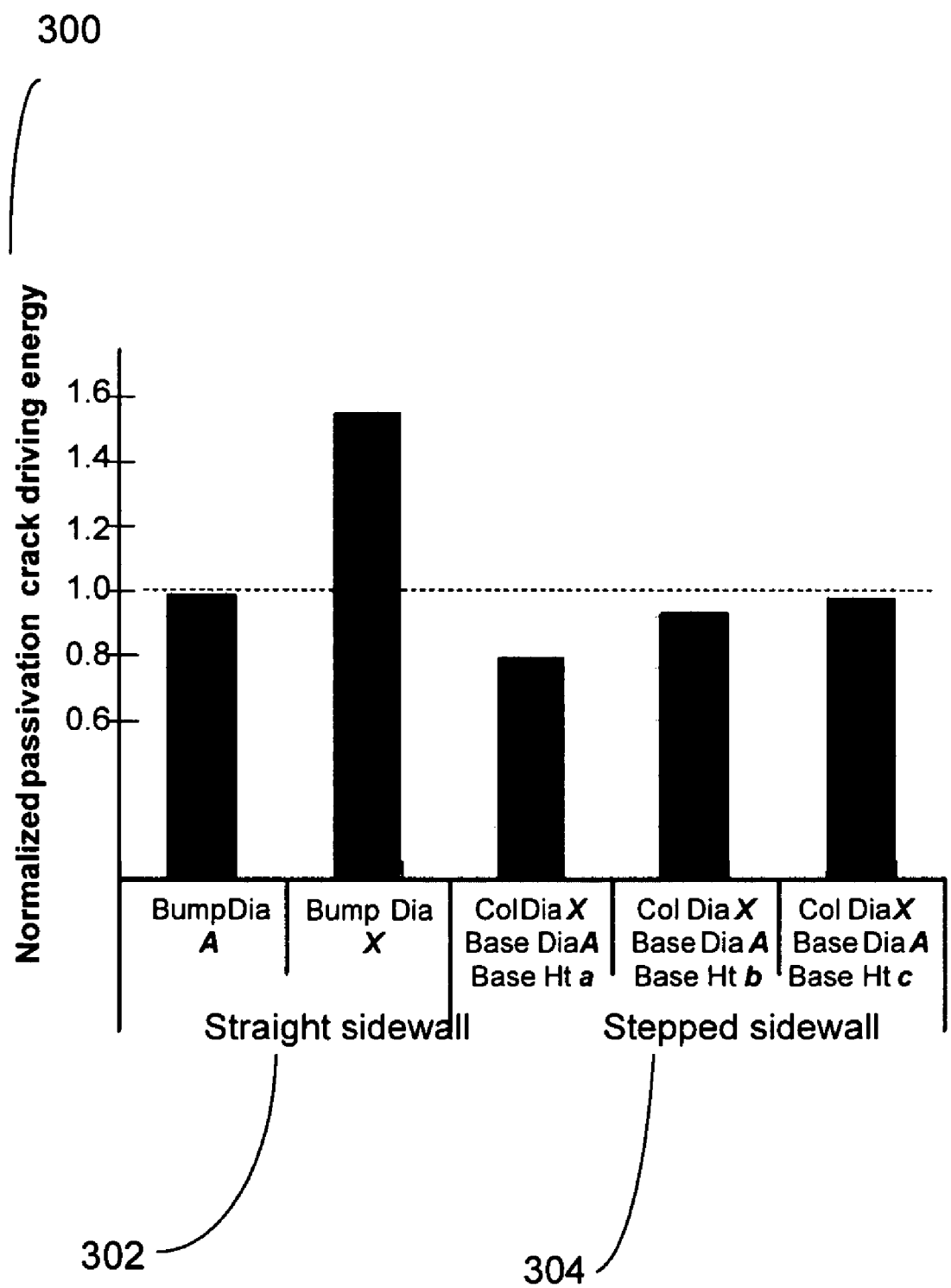
FIGS. 3a-3b represent graphs according to an embodiment of the present invention.

FIG. 3a shows finite element modeling (FEM) results that compare the crack driving energy in a passivation layer 300, such as may be present on a surface of the substrate 200, for example for various die-side conductive interconnect structure geometries. Results for a conventional straight sidewall 302 die-side interconnect structure and for several version of a stepped sidewall die-side interconnect structure 304 are presented (wherein diameter A is greater than diameter X). In some cases, increasing the base diameter by about 30% achieves a 35-50% reduction in the energy that may drive cracking in a passivation layer.

Figure 3B:
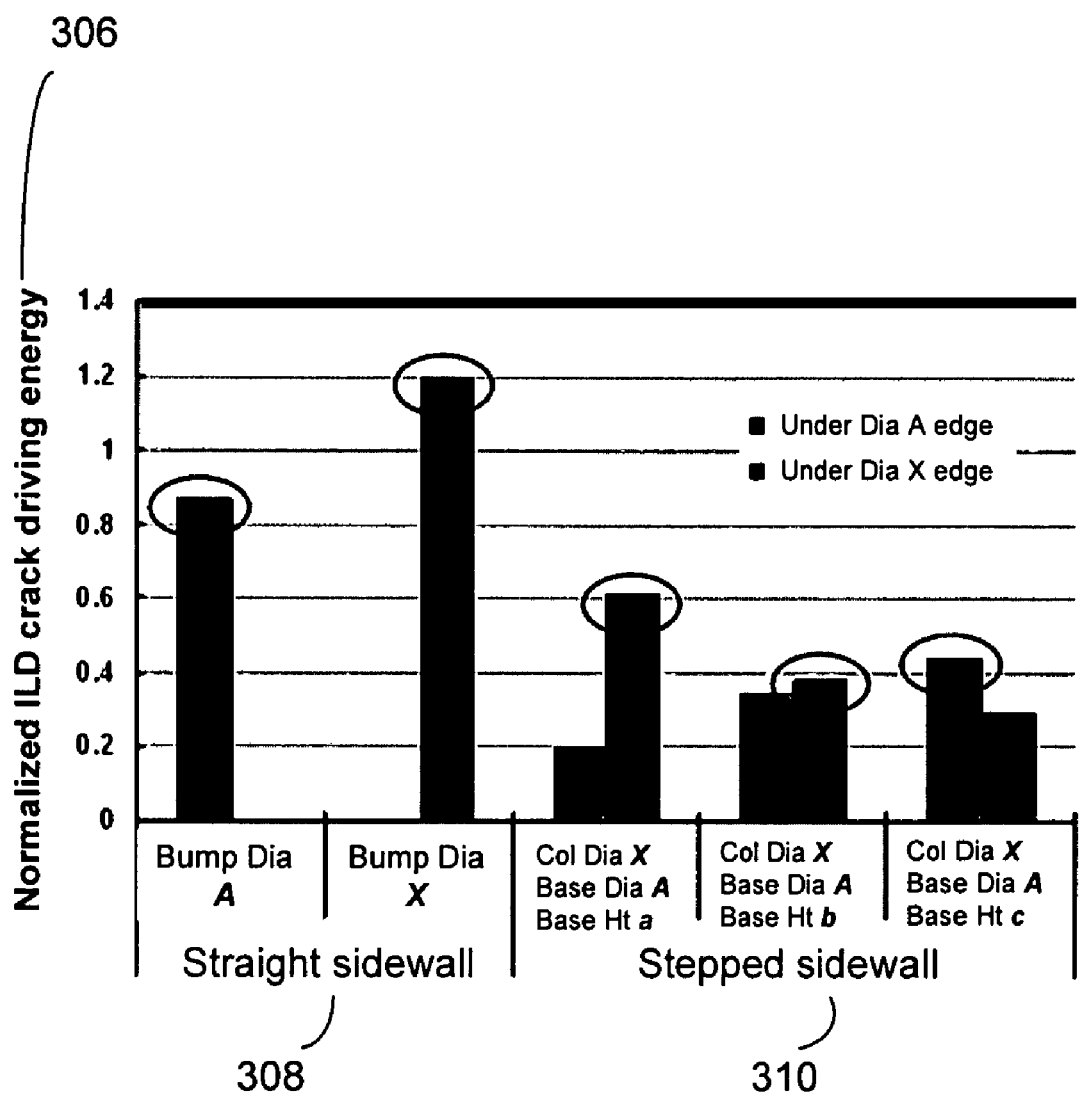

FIG. 3b depicts a similar benefit from increasing the base portion diameter of a die-side conductive interconnect structure on reducing ILD stress in a device interconnect layer, such as device interconnect layer 104 and device interconnect layer 204. ILD cracking drive energy 306 is shown for straight sidewall die-side conductive interconnect structures 308 and various stepped die-side conductive interconnect structure geometries 310. In some cases, up to a 25% reduction in crack driving energy within the ILD in the device interconnect layer 104/204 is realized.

The die-side conductive interconnects of the embodiments of the present invention significantly decrease the thermomechanical stress in die passivation and ILD layers without sacrificing the product performance. A smaller base portion diameter at the package side/solder interface transfers less stress from the package substrate. The larger base portion diameter at the die-side/passivation interface redistributes the stress transferred from the package substrate chip attach processes, for example, and thus the stress in passivation and low k ILD layers can be decreased significantly. Smaller columnar portion diameters can also improve solder wetting for a fixed package solder volume during assembly processes.

Figure 4:
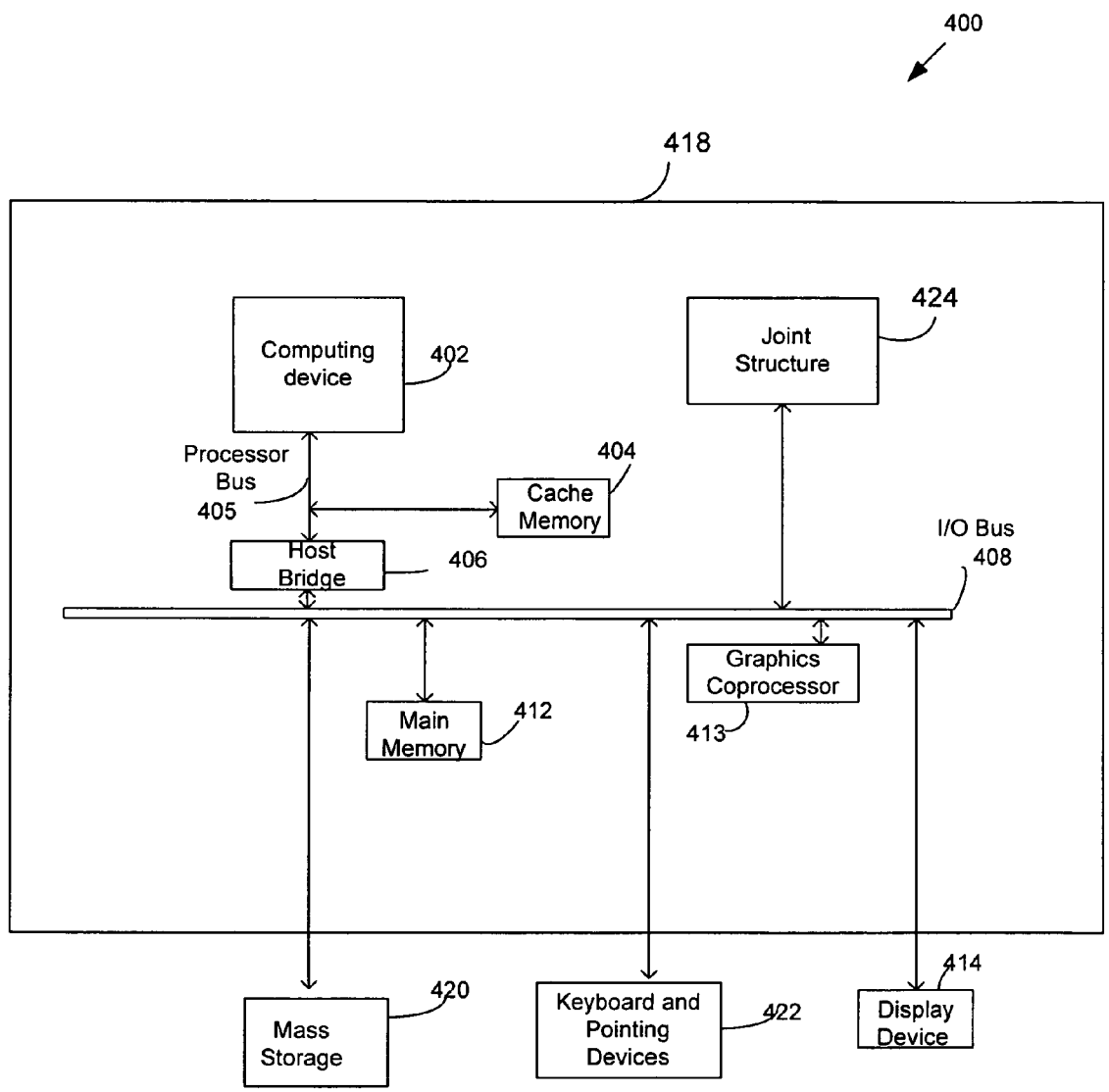
FIG. 4 represents a system according to an embodiment of the present invention.

FIG. 4 is a diagram illustrating an exemplary system 400 capable of being operated with microelectronic structures of the present invention, such as the joint structure 226 comprising the die side conductive interconnect structure 224 of FIG. 2d, for example. It will be understood that the present embodiment is but one of many possible systems in which the conductive interconnect structure of the present invention may be used.

In the system 400, the joint structure 424 may be communicatively coupled to a printed circuit board (PCB) 418 by way of an I/O bus 408. The communicative coupling of the joint structure 424 may be established by physical means, such as through the use of a package and/or a socket connection to mount the joint structure 424 to the PCB 418 (for example by the use of a chip package, interposer and/or a land grid array socket). The joint structure 424 may also be communicatively coupled to the PCB 418 through various wireless means (for example, without the use of a physical connection to the PCB), as are well known in the art.

The system 400 may include a computing device 402, such as a processor, and a cache memory 404 communicatively coupled to each other through a processor bus 405. The processor bus 405 and the I/O bus 408 may be bridged by a host bridge 406. Communicatively coupled to the I/O bus 408 and also to the joint structure 424 may be a main memory 412. Examples of the main memory 412 may include, but are not limited to, static random access memory (SRAM) and/or dynamic random access memory (DRAM), and/or some other state preserving mediums. The system 400 may also include a graphics coprocessor 413, however incorporation of the graphics coprocessor 413 into the system 400 is not necessary to the operation of the system 400. Coupled to the I/O bus 408 may also, for example, be a display device 414, a mass storage device 420, and keyboard and pointing devices 422.

These elements perform their conventional functions well known in the art. In particular, mass storage 420 may be used to provide long-term storage for the executable instructions for a method for forming joint structure in accordance with embodiments of the present invention, whereas main memory 412 may be used to store on a shorter term basis the executable instructions of a method for forming joint structure in accordance with embodiments of the present invention during execution by computing device 402. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 412 may supply the computing device 202 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as a microelectronic packages, are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
    forming a die-side conductive interconnect structure on a portion of a die, wherein the die comprises a low K ILD layer adjacent the die side conductive interconnect structure, wherein the die-side conductive interconnect structure is formed by using non-organic containing interconnect material, and wherein the die-side conductive interconnect structure comprises a columnar portion and a base portion, wherein a diameter of the base portion is greater than the diameter of the columnar portion and wherein CTE mismatch moments between the die-side conductive interconnect structure and the low K ILD layer are substantially contained within the base portion.

2. The method of claim 1 wherein the diameter of the columnar portion is about 50 percent to about 80 percent of the diameter of the base portion.

3. The method of claim 1 wherein forming the die-side conductive interconnect structure comprises forming a copper bump.

4. The method of claim 1 wherein forming the die-side conductive interconnect comprises:
    forming the base portion on the portion of the die; and
    forming the columnar portion on a top surface of the base portion.

5. The method of claim 4 further comprising wherein the columnar portion is attached to at least one solder bump disposed on a package substrate.

6. The method of claim 5 wherein the at least one solder bump comprises a substantially lead free solder bump.

7. The method of claim 6 further comprising wherein the low k ILD layer is disposed on a device interconnect layer.

8. The method of claim 7 further comprising wherein the device interconnect layer comprises a multilayer dielectric stack.

9. The method of claim 4 wherein forming the base portion comprises:
    forming a copper seed layer on the portion of the die;
    patterning a photoresist layer to define a diameter of the base portion;
    forming the base portion on the copper seed layer by utilizing a physical deposition process; and
    removing the photoresist layer.

10. The method of claim 4 wherein forming the columnar portion comprises:
    patterning a photoresist layer on the base portion to define a diameter of the columnar portion;
    forming the columnar portion on the base portion by utilizing a deposition process; and
    removing the photoresist layer.

11. A method of forming a die-side conductive interconnect comprising:
    forming a die-side conductive interconnect on a substrate, wherein the substrate comprises a low K ILD layer adjacent the die side conductive interconnect structure, and wherein the die-side conductive interconnect structure is formed by using a non-organic containing interconnect material, and wherein the die-side conductive interconnect comprises a base potion and a columnar portion; and
    coupling the columnar portion of the die-side conductive interconnect to a solder bump disposed on a package substrate,
    wherein CTE mismatch moments between the die-side conductive interconnect structure and the low K ILD layer are substantially contained within the base portion.

12. The method of claim 11 further comprising wherein a diameter of the base portion is greater than a diameter of the columnar portion.

* * * * *